United States Patent
Kwon

[11] Patent Number: 5,966,609
[45] Date of Patent: Oct. 12, 1999

[54] METHOD OF FABRICATING DOME-SHAPED SEMICONDUCTOR DEVICE

[75] Inventor: Jae-Soon Kwon, Buchon, Rep. of Korea

[73] Assignee: LG Semicon Co., Ltd., Chungcheongbuk-do, Rep. of Korea

[21] Appl. No.: 08/974,464

[22] Filed: Nov. 20, 1997

[30] Foreign Application Priority Data

May 24, 1997 [KR] Rep. of Korea ........................ 97-20559

[51] Int. Cl.⁶ ................................................. H01L 21/20
[52] U.S. Cl. ............................................ 438/396; 438/397
[58] Field of Search ...................... 438/396, 397; 257/388

[56] References Cited

U.S. PATENT DOCUMENTS 5,818,092  10/1998  Bai et al. ................................ 438/396

Primary Examiner—Chandra Chaudhari
Assistant Examiner—Craig Thompson

[57] ABSTRACT

A semiconductor device and a fabrication method thereof which are capable of enhancing the electrostatic capacity of a capacitor and preventing a short channel effect which occurs due to the decrease of a channel width. The semiconductor device includes a semiconductor substrate having a protrusion, a first insulation film formed on a lateral surface of the protrusion and on the semiconductor substrate neighboring with the protrusion, a conductive type sidewall spacer formed on the first insulation film, a first dopant region formed on an upper surface of the protrusion, a second dopant region formed in the semiconductor substrate in an outer portion from the conductive type sidewall spacer, an insulation film pattern formed on a surface of the conductive type sidewall spacer, a first conductive layer pattern contacting with the second dopant region and formed on the insulation film pattern, an interlayer insulation layer formed on an upper surface of the first conductive layer pattern, and a second conductive layer pattern formed on the interlayer insulation layer.

18 Claims, 15 Drawing Sheets

METHOD OF FABRICATING DOME-SHAPED SEMICONDUCTOR DEVICE

BACKGROUND OF THE INVENTION

1. Field of the Invention

The present invention relates to a semiconductor device and a fabrication method thereof, and in particular to an improved semiconductor device and a fabrication method thereof by which it is possible to fabricate a dome-shaped semiconductor device.

2. Description of the Conventional Art

As a semiconductor device for increasing the integrity and electrostatic capacitance thereof, a pillar type capacitor of a conventional semiconductor device as shown in FIG. 1 and a fin type capacitor as shown in FIG. 3 have been used.

The conventional semiconductor device having a pillar type capacitor and a fabrication method thereof will now be explained.

First, FIG. 1 illustrates a conventional semiconductor device having a conventional pillar type capacitor. As shown therein, on a semiconductor substrate 1, a word line 2 is formed. Dopant regions 19a and 19b are formed in the semiconductor substrate 1 at both sides of the word line 2. The word line 2 acts as a gate electrode, and the dopant regions 19a and 19b act as a source electrode and a drain electrode, respectively. A silicon oxide film 3 which acts as an insulation film, is formed on the upper surface of the semiconductor substrate 1, and a silicon nitride film 4 is formed on the upper surface of the silicon film 3. A contact hole 19 is formed to pass through the silicon oxide film 3 and the silicon insulation film 4, respectively, and communicates with the drain electrode 19b. A polysilicon film 11 is formed within the contact hole 18 and on the upper surface of the silicon nitride film 4. At this time, the polysilicon film 11 acts as a node electrode 14 of the capacitor. An insulation film 12 which acts as a dielectric, is formed on the 5 polysilicon film 11 and the silicon nitride film 14. A conductive polysilicon film 13 is formed on the surface of the insulation film 12. The polysilicon film 13 becomes a plate electrode 13 of the capacitor. An insulation film 17 having a flat surface is formed on the upper surface of the plate electrode 13. A contact hole is formed in a portion of the source electrode 19a. A bit line 14 of a polysilicon layer which is a conductive layer, is formed on the upper surface of the insulation film 17 and on an inner surface of the contact hole is formed and is connected with the source electrode 19a.

The fabrication method of a semiconductor device having a pillar type capacitor will now be explained with reference to FIGS. 2A through 2H.

First, as shown in FIG. 2A, a gate electrode 2 made of a polysilicon is formed on the upper surface of the p-type semiconductor substrate 1, and an n-type dopant ion is implanted into the semiconductor substrate at both sides of the gate electrode 2 by a self-align method for thus forming the source electrode 19a and the drain electrode 19b, and then a multiple layer film 20 is formed on the upper surface of the semiconductor substrate 1 by a CVD (Chemical Vapor Deposition) method in such a manner that the gate electrode 2, the source electrode 19a, and the drain electrode 19b are surrounded thereby. The multiple insulation film 20 is formed by sequentially depositing a silicon oxide film 3, a silicon nitride film 4, and a silicon oxide film 5 on the upper surface of the semiconductor substrate. The silicon nitride film 4 is used as an etching finishing film.

Next, as shown in FIG. 2B, a contact hole 18 is formed by selectively and anisotropically etching the multiple insulation film 20 formed on the drain electrode 19b. A polysilicon layer is deposited on an inner surface of the contact hole 18 and the upper surface of the multiple insulation film 20. The first conductive layer 6 is used as a node electrode of the capacitor. A n-type dopant may be added to the first conductive layer 6 for increasing a conductivity of the first conductive layer 6. In the method for adding the n-type dopant, the n-type dopant is mixed with a deposition gas for forming the first conductive layer 6, so that the n-type dopant is added to the first conductive layer 6 at the time of depositing the conductive layer 6. In another method for adding the same, the first conductive layer 6 formed of a non-doped polysilicon layer is formed by the CVD (Chemical Vapor Deposition) method, and then the n-type dopant ion may be implanted by an ion implantation method. The first conductive layer 6 may be formed of a polysilicon layer, or the first conductive layer 6 may be formed of a high temperature melting metal or a silicide film formed of a high temperature melting metal.

Next, as shown in FIG. 2C, on the upper surface of the first conductive layer 6, a multiple insulation film 30 formed of a first silicon oxide film (non-doped silicate glass: hereinafter called a first NSG) 7, a $P_2O_5$-doped silicon oxide film (phosphor silicate glass: hereinafter called a PSG) 8, and a second non-doped silicon oxide film (non-doped silicate glass: hereinafter called a second NSG) 9 is formed. Thereafter, the multiple insulation film 30 is annealed at a temperature of about 900° C. for about 20 minutes. The etching speeds of the first NSG 7, the PSG 8 and the second NSG 9 of the multiple insulation film 30 are different at the time of wet-etching, compared to the state that the annealing is not performed. An etching mask (not shown) is formed on the second NSG 9, and the multiple insulation film 70 is anisotropically etched by using the etching mask for thus forming a pattern having a vertical lateral surface on the first conductive layer 6 on the contact hole 18. When etching the resultant structure by a reactive ion etching method by using the photoresist film as an etching mask, and a chloro fluoro carbon as an etching gas, since there is an etching speed difference between the second NSG 9, the PSG 8, and the first NSG 7, it is possible to obtain a desired pattern having a vertical lateral surface.

Next, as shown in FIG. 2D, the multiple insulation film 30 formed of the second NSG 9, the PSG 8 and the first NSG 7 is wet-etched for about 2 minutes by using a 20:1 solution of $NH_3$:HF. At this time, when wet-etching the resultant structure by using the 20:1 solution of $NH_3$:HF, since the PSG 8 having a high density dopant has a high etching speed compared to the first NSG 7 and the second NSG 9, it is possible to obtain a pattern having a recessed etching lateral surface of the PSG 8 as shown in FIG. 2D.

Next, the second conductive layer 10 formed of a polysilicon layer having an n-type dopant as shown in FIG. 2E is formed on the upper surface of the first conductive layer 6 in such a manner that the second conductive layer 10 fully covers the NSG 9, the PSG 8 and the first NSG 7. Preferably, the second conductive layer is formed of a polysilicon layer having a dopant in order to reduce the resistance. The semiconductor substrate 1 is inserted into a chemical vapor deposition reactor, and the second conductive layer 10 is deposited in a state that the temperature of the chemical vapor deposition reactor is increased to a temperature of above 450° C. in order to prevent the resistance from being increased as the insulation film is formed due to a natural oxide film formed on a boundary surface between the first conductive layer 6 and the second conductive layer 10.

The second conductive layer 10, as shown in FIG. 2E, is etched back by an anisotropical etching process until the second NSG 9 is exposed, so that the second conductive layer 10 remains on only the lateral surfaces of the second NSG 9, the PSG 8, and the first NSG 7 as shown in FIG. 2F.

As shown in FIG. 2G, the second NSG 9, the PSG 8, and the first NSG 7 are etched by using a hydrogen fluoride solution, and then the node electrode 11 of the capacitor is formed. At this time, the silicon oxide film 5 is also etched. In addition, since the silicon nitride film 4 is not etched with respect to the hydrogen fluoride solution, the silicon nitride film 4 is used as an etching finishing film.

An insulation film 12 which is a dielectric, is formed on the upper surface of the silicon nitride film 4 and the surface of the node electrode 11, and a conductive layer 13 is formed on the upper surface of the insulation film 12, as illustrated in FIG. 2H. The thusly formed insulation film 12 becomes a dielectric film of a capacitor, and the conductive layer 13 becomes a plate electrode 13 of the capacitor. An insulation film 17 is formed on the upper surface of the plate electrode 13, and then the semiconductor substrate 1 is flattened. The insulation film 17, the insulation film 12, the silicon nitride film 4, and the silicon oxide film 3 which are formed on the source electrode 19a, are etched for thus forming a contact hole. Thereafter, the polysilicon is deposited on the contact hole and then is patterned for thus forming a bit line 14 connected with the source electrode 19a and finishing the fabrication of a semiconductor memory device having a pillar type capacitor.

FIG. 3 illustrates a conventional semiconductor device having a fin type capacitor. As shown therein, a word line (not shown) is formed on the semiconductor substrate 1, and a gate electrode 2 connected with the word line 2 is formed therein. Dopant regions 19a and 19b are formed within the semiconductor substrate 1 at both sides of the gate electrode 2. The dopant regions 19a and 19b act as a source and drain electrode, respectively. An insulation layer 15 is formed on the upper surface of the gate electrode 2, a contact hole is formed on the upper surface of the source electrode 19a and is connected with the bit line 14 and the source electrode 19a, respectively. Another contact hole is formed in a predetermined portion of the drain electrode 19b and is connected with the node electrode 11 and the drain electrode, respectively, of the capacitor. An insulation film 12 which is a dielectric, is formed on the surface of the node electrode 11, and a plate electrode 13 of the capacitor is formed in such a manner that the plate electrode 13 surrounds the dielectric 12.

The conventional fabrication method for a semiconductor device having a fin type capacitor as shown in FIG. 3 will now be explained with reference to FIGS. 4A through 4G.

First, as shown in FIG. 4A, a word line (not shown) is formed on the upper surface of the semiconductor substrate 1, and the gate electrode 2 is connected with the word line. A dopant ion is implanted into the semiconductor substrate 1 at both sides of the gate electrode 2 for thus forming a source electrode 19a and a drain electrode 19b, respectively.

Next, as shown in FIG. 4B, a $Si_3N_4$ film 15 which acts as an insulation film, is formed on the semiconductor substrate 1 by a chemical vapor deposition method in such a manner that the $Si_3N_4$ film 15 covers the gate electrode 2.

As shown in FIG. 4C, a first silicon oxide film 60, a polysilicon layer 61, and a second silicon oxide film 62 are sequentially formed on the $Si_3N_4$ film 15 which acts as an insulation film, and the first silicon oxide film 60, the polysilicon layer 61, and the second silicon oxide film 62 which are formed on the upper surface of the drain electrode 19b are etched for thus forming a contact hole 18 and exposing the drain electrode 19b.

As shown in FIG. 4D, a second polysilicon film 63 is deposited in the contact hole 18 and on the upper surface of the second silicon oxide film 62, respectively, and an n-type dopant is doped thereon in order to reduce the resistance of the second polysilicon film 63.

As shown in FIG. 4E, the second polysilicon film 63 is patterned, and the second silicon oxide film 62 is etched and is fully removed. Thereafter, as shown in FIG. 4F, the first polysilicon film 61 is patterned, and the first silicon oxide film 60 formed below the first polysilicon film 61 is etched and removed for thus forming a node electrode 11 of the capacitor as shown in FIG. 4F.

As shown in FIG. 4G, an insulation film 12 which acts as a dielectric, is formed on the surface of the node electrode 11 of the capacitor, and a polysilicon layer 13 is formed on the surface of the insulation film 12 for thus forming a plate electrode 13 of the capacitor. Thereafter, the insulation film 15 formed on the source electrode 19a is etched, thus forming a contact hole. A polysilicon layer is formed on the upper surface of the insulation film 15 and is patterned, thus forming a bit line 14 and finishing the fabrication of a semiconductor device.

As integration of the semiconductor device is increased, and a space for forming a capacitor therein is reduced, there is a limit for increasing the electrostatic capacity of a conventional capacitor. In addition, in the conventional semiconductor device, as integration is increased, the length of a word line is shortened, and the short channel effect occurs thereby. Furthermore, a contact error may occur in the source and drain electrodes, and a contact resistance may be increased, thus extending an operational time of a cell.

SUMMARY OF THE INVENTION

Accordingly, it is an object of the present invention to provide a semiconductor device and a fabrication method thereof which overcomes the aforementioned problem encountered in the conventional art.

It is another object of the present invention to provide an improved semiconductor device and a fabrication method thereof which are capable of enhancing the electrostatic capacity of a capacitor and preventing a short channel effect which occurs due to the decrease of a channel width.

To achieve the above objects, there is provided a semiconductor device which includes a semiconductor substrate having a protrusion, a first insulation film formed on a lateral surface of the protrusion and on the semiconductor substrate neighboring with the protrusion, a conductive type sidewall spacer formed on the first insulation film, a first dopant region formed on an upper surface of the protrusion, a second dopant region formed in the semiconductor substrate formed in an outer portion of the conductive type sidewall spacer, an insulation film pattern formed on a surface of the conductive type sidewall spacer, a first conductive layer pattern contacting with the second dopant region and formed on the insulation film pattern, an interlayer insulation layer formed on an upper surface of the first conductive layer pattern, and a second conductive layer pattern formed on the interlayer insulation layer.

To achieve the above objects, there is provided a semiconductor device fabrication method which includes the steps of preparing a semiconductor substrate having a protrusion, forming a gate insulation layer (or a first insulation film) on a lateral surface of the protrusion and on a portion of the semiconductor substrate neighboring with the protrusion, forming a conductive sidewall spacer on the first insulation film formed on a lateral surface of the protrusion, forming a first dopant region on an upper surface of the protrusion and forming a second dopant region in the semiconductor substrate in an outer portion of the conductive sidewall spacer, and upper surfaces of the protrusion and the semiconductor surface, forming an insulation layer on the semiconductor substrate including the conductive sidewall spacer, forming an insulation film pattern, forming a contact region so that a portion of the second dopant region is exposed, forming a first conductive layer pattern on the insulation film pattern and the contact region, forming an interlayer insulation layer on the first conductive layer pattern, and forming a second conductive layer pattern on the interlayer insulation layer.

Additional advantages, objects and features of the invention will become more apparent from the description which follows.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

A semiconductor device and a fabrication method thereof according to the present invention will now be explained with reference to the accompanying drawings.

Figure 1:
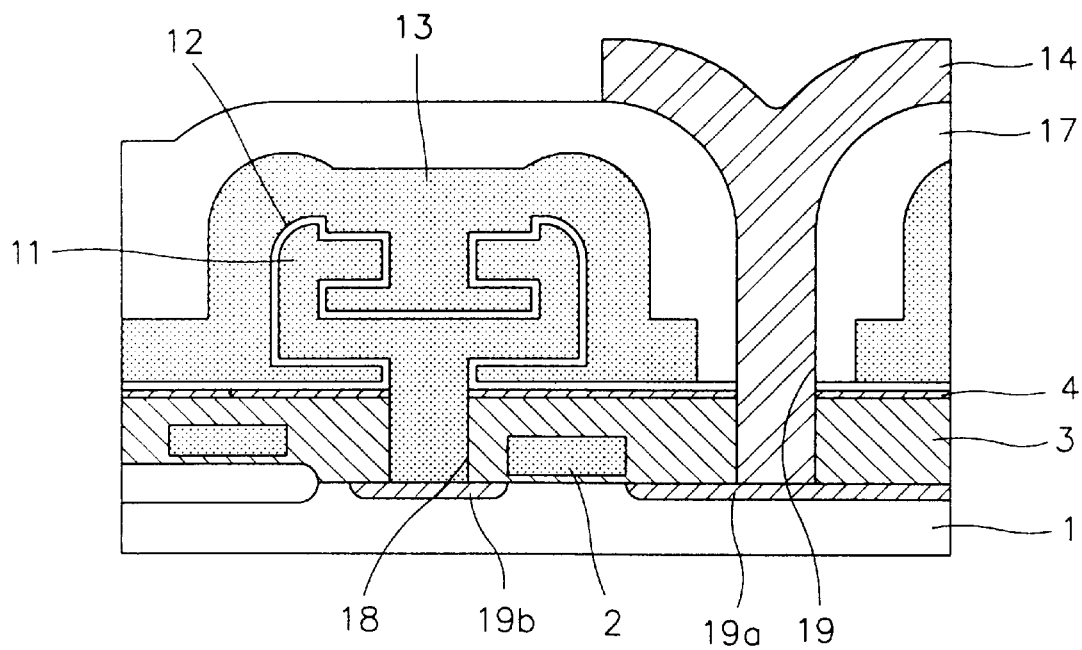
FIG. 1 is a cross-sectional view illustrating a conventional semiconductor device having a pillar type capacitor.
Figure 2A:
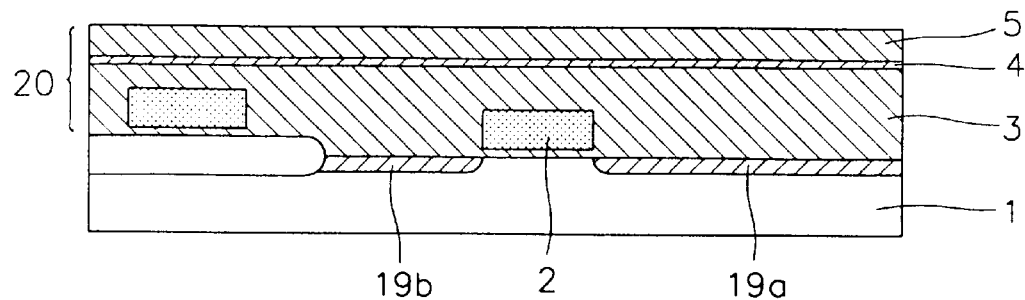
FIGS. 2A through 2H are cross-sectional views illustrating a fabrication process of a conventional semiconductor device having a pillar type capacitor.
Figure 2B:
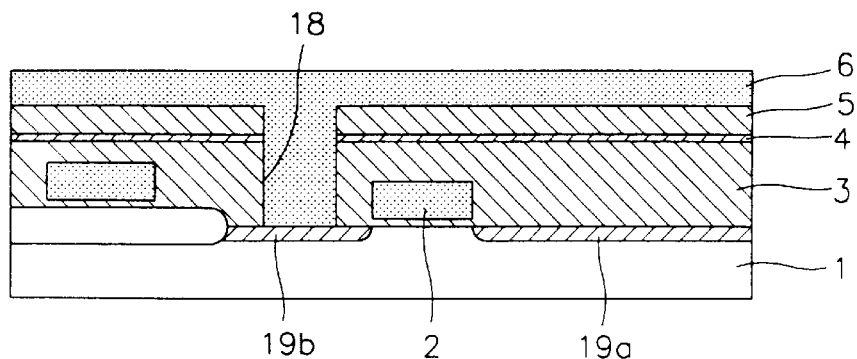
Figure 2C:
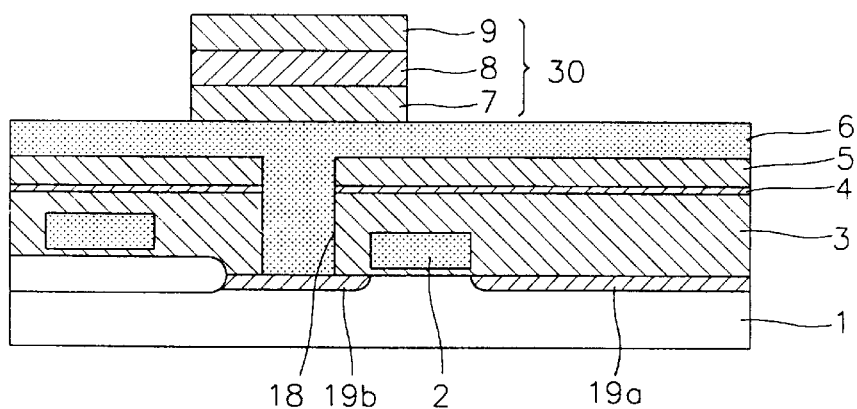
Figure 2D:
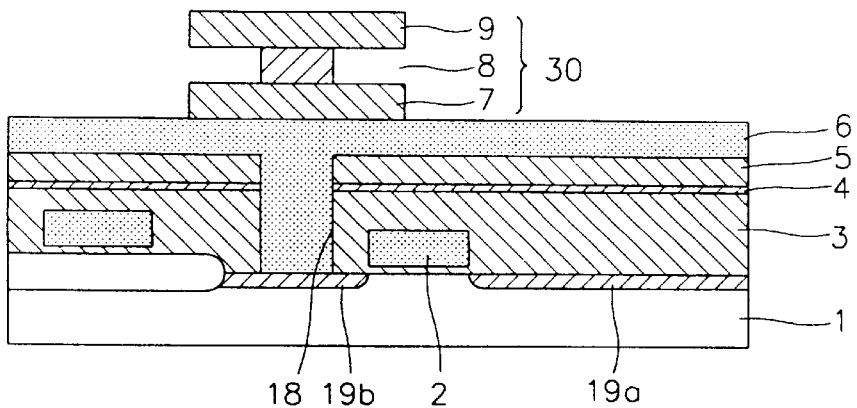
Figure 2E:
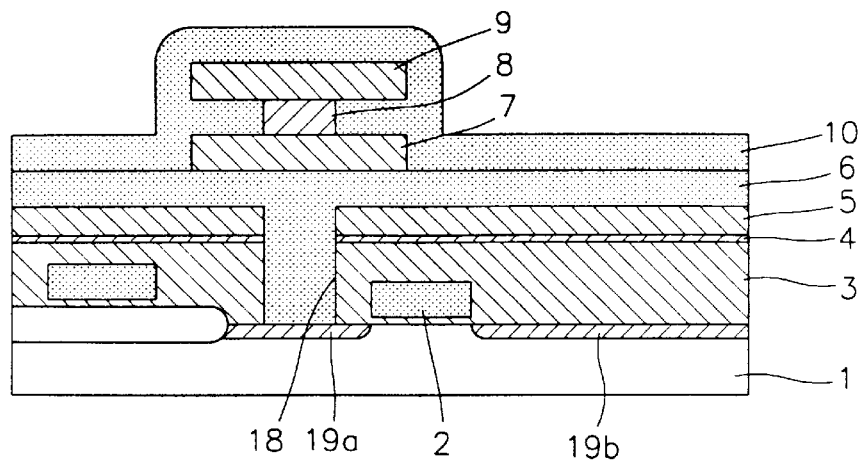
Figure 2F:
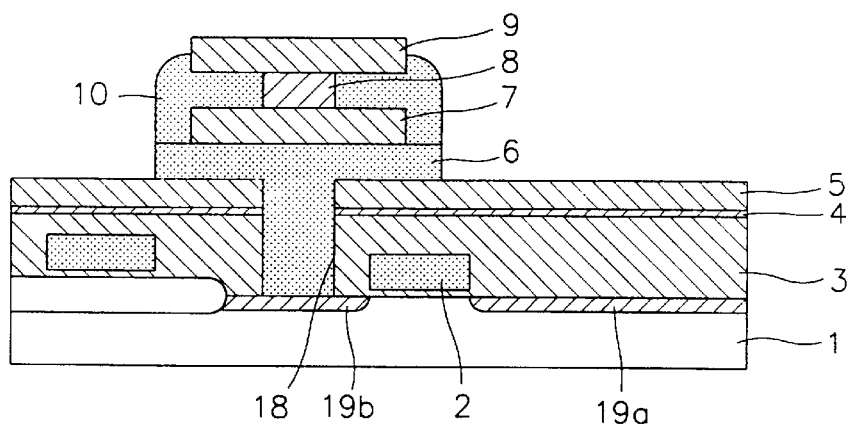
Figure 2G:
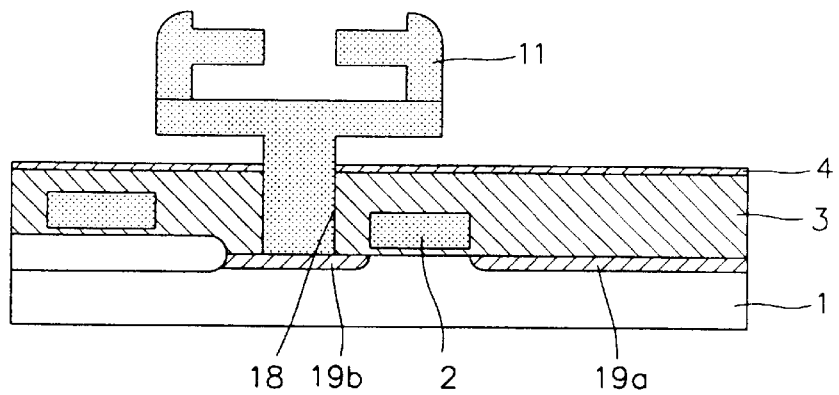
Figure 2H:
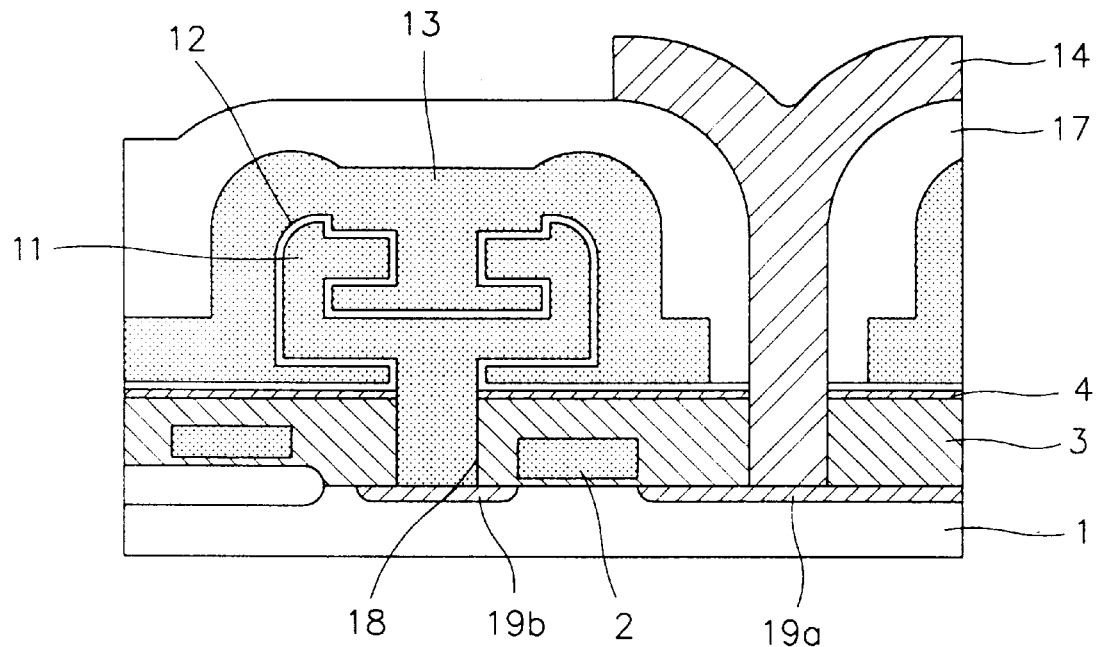
Figure 3:
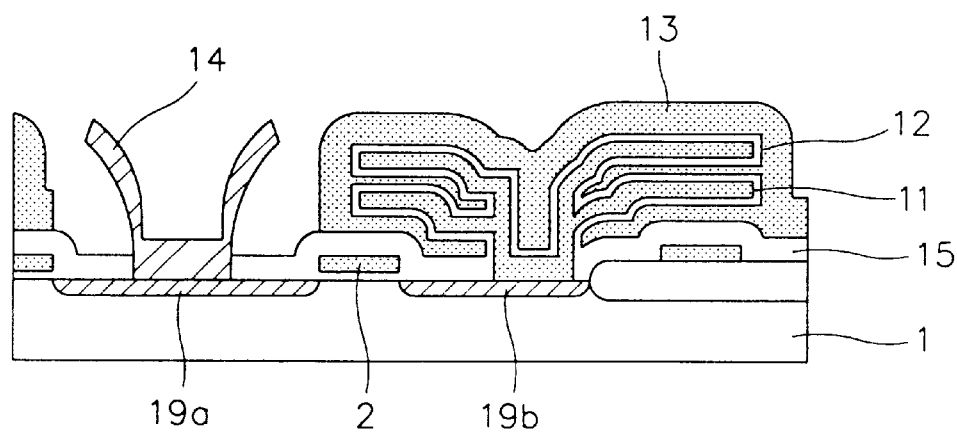
FIG. 3 is a cross-sectional view illustrating a conventional semiconductor device having a fin type capacitor.
Figure 4A:
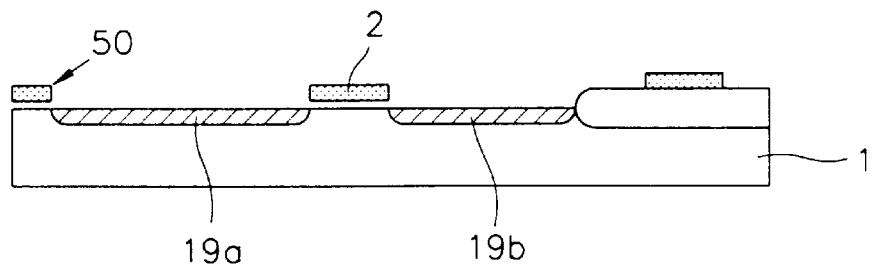
FIGS. 4A through 4G are cross-sectional views illustrating a fabrication process of a semiconductor device having a fin type capacitor according to the present invention.
Figure 4B:
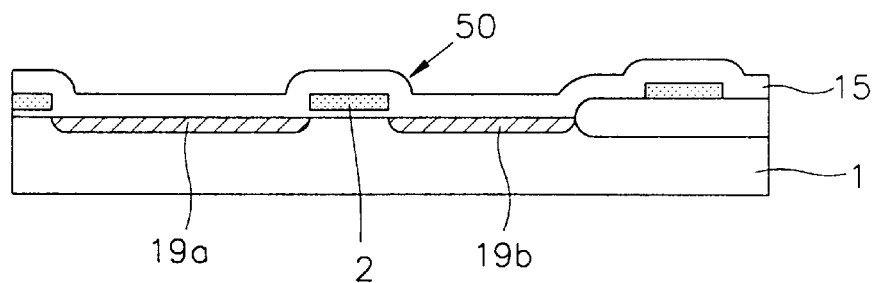
Figure 4C:
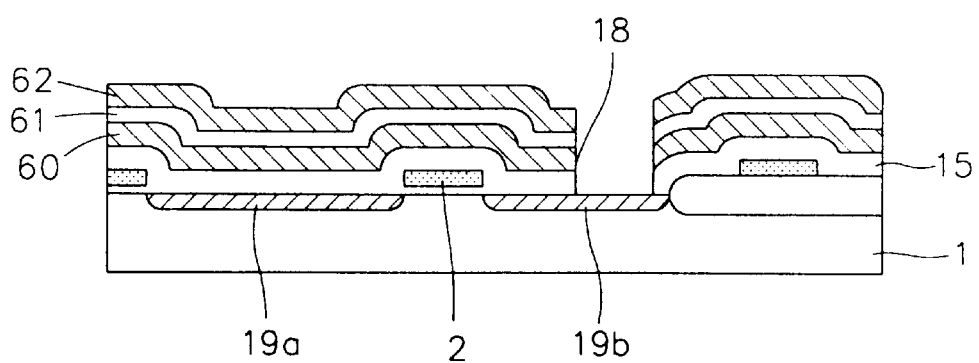
Figure 4D:
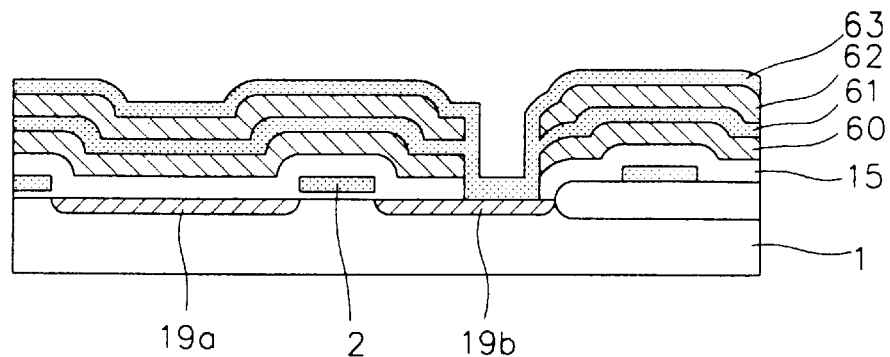
Figure 4E:
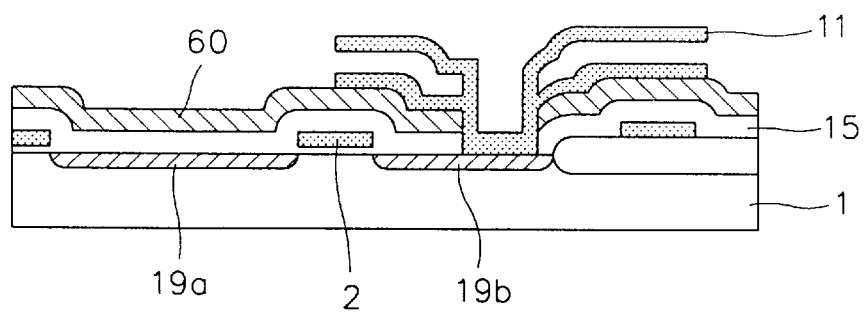
Figure 4F:
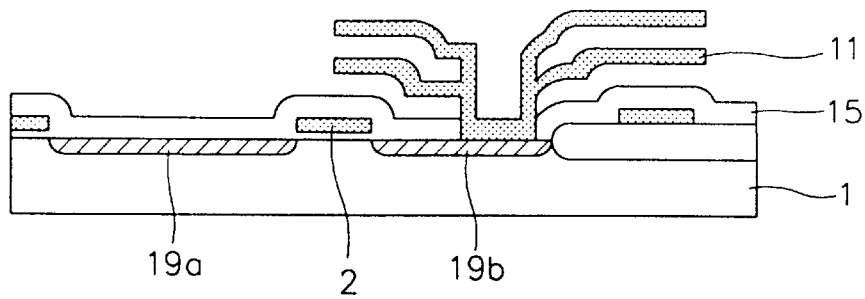
Figure 4G:
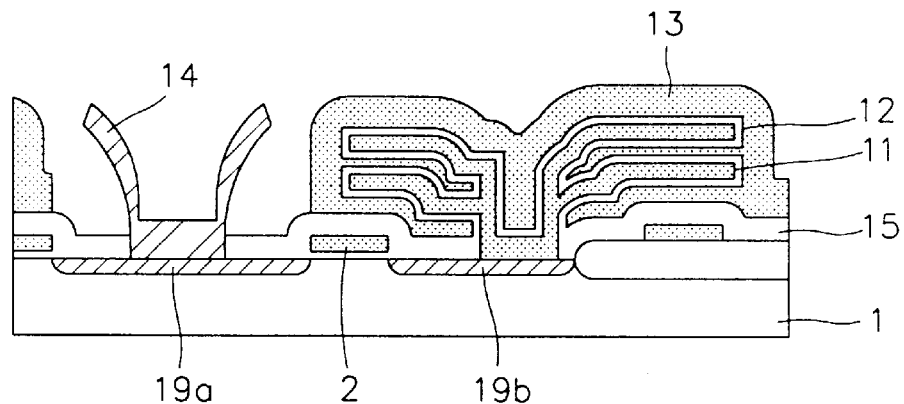
Figure 5:
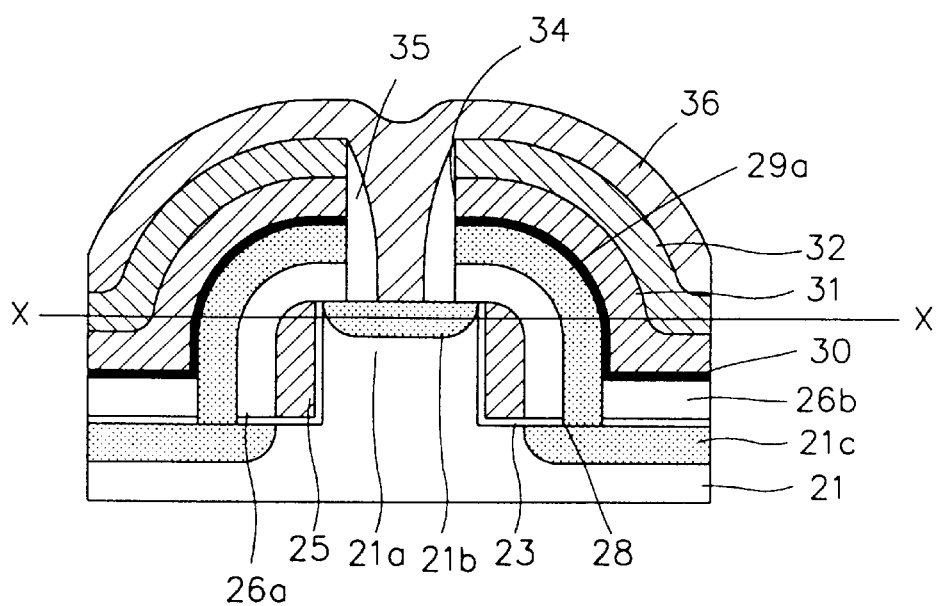
FIG. 5 is a cross-sectional view illustrating a dome-shaped DRAM cell according to the present invention.

FIG. 5 illustrates a dome-shaped DRAM cell according to the present invention. As shown therein, in the semiconductor device according to the present invention, a protrusion 21a is formed on a semiconductor substrate 21. A gate oxide film 23 is formed on an upper surface and a lateral surface of the protrusion 21a and on an upper surface of the semiconductor substrate 21. A source electrode 21b which is a first dopant region, is formed on the upper surface of the protrusion 21a. A gate electrode 25 is formed by a side wall spacer formed of a polysilicon layer which spacer surrounds the protrusion 21a. A drain electrode 21c which is a second dopant region, is formed in the semiconductor substrate 21 at an outer portion of the gate electrode 25. An insulation pattern 26a is formed to surround the gate electrode 25. A contact hole 28 is formed in a predetermined portion of the drain 21c along an outer side of the insulation film pattern 26a. A node electrode 29a of a capacitor is formed on the upper surface of the insulation film pattern 26a and contacts with the contact hole 28. An insulation film pattern 26b of the capacitor is formed on the upper surface of the semiconductor substrate and outside the node electrode 29a, and the node electrode 29a and the insulation film pattern 26b is covered by the interlayer insulation film 30 which is a dielectric. A plate electrode 31 of the capacitor is formed on the upper surface of the interlayer insulation film 30, and an insulation film 32 is formed on the upper surface of the plate electrode 31. A contact hole 34 is formed on the upper surface of the protrusion 21a. A sidewall spacer 35 which is formed of an insulation film, is formed on a lateral surface of the contact hole 34, and a bit line 36 made of a polysilicon is formed within the contact hole and on the upper surface of the insulation film 32.

Figure 6:
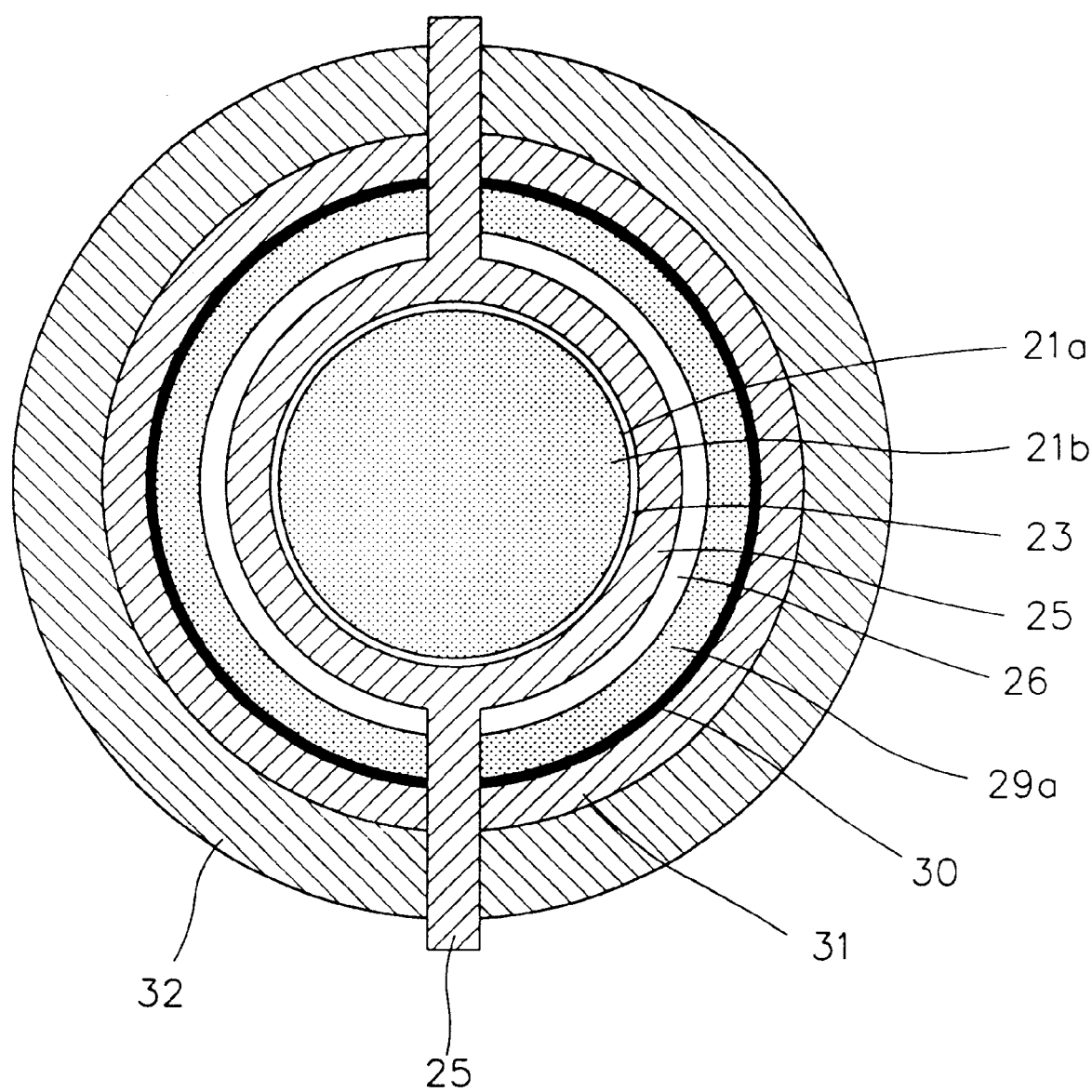
FIG. 6 is a horizontal cross-sectional view taken along line X–X' of FIG. 5.

FIG. 6 illustrates a cross-sectional view taken along line X–X' of FIG. 5. As shown therein, a gate oxide film 23 is formed to surround the protrusion 21a, a gate electrode 25 is formed around the gate oxide film 23, a word line 25a is connected with the gate electrode 25, an insulation film 26 surrounds an outer lateral surface of the gate electrode 25, a node electrode 29a of the capacitor, an interlayer insulation layer 30 and a capacitor plate electrode 31 are formed to surround an outer lateral surface of the insulation film 26, and an insulation film 32 is formed to surround the plate electrode 31 of the capacitor.

Figure 7:
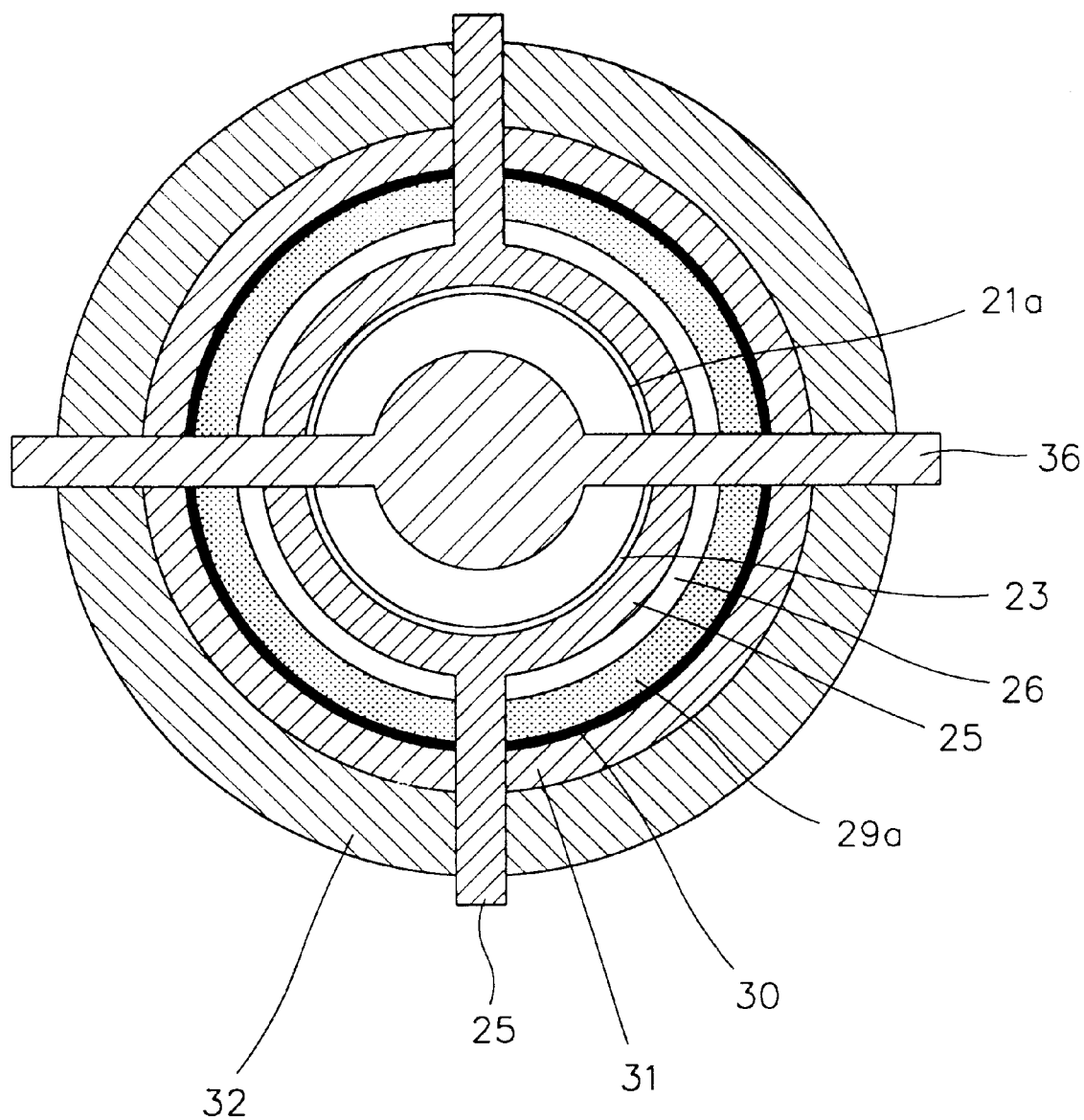
FIG. 7 is a plan view illustrating a DRAM cell according to the present invention.

FIG. 7 illustrates a plan view illustrating the semiconductor device as shown in FIG. 5. As shown therein, the gate oxide film 23 and the gate electrode 25 surround an outer lateral surface of the protrusion 21a, a word line 25a is formed for being connected with the gate electrode 25, an insulation film 26 surrounds the gate electrode 25 formed in an outer lateral portion of the insulation film 26, the node electrode 29a which is a first electrode of the capacitor, the interlayer insulation layer 30 which is a dielectric layer, and the plate electrode 31 which is a second electrode of the capacitor surround the outer lateral portion of the insulation film 26, and the bit line 36 connected to the upper surface of the protrusion 21a is formed crossingly with respect to the direction of the word line 25.

The fabrication method of a semiconductor device according to the present invention will now be explained with reference to the accompanying drawings.

Figure 8A:
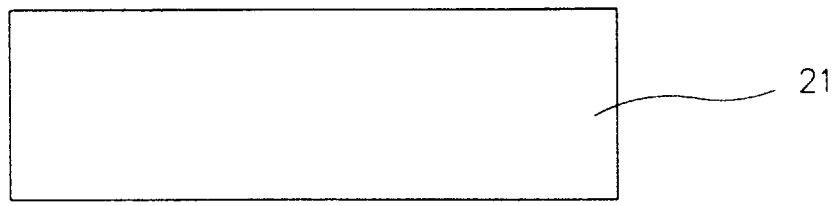
FIGS. 8A through 8Q are cross-sectional views illustrating a fabrication process of a DRAM cell according to the present invention.
Figure 8B:
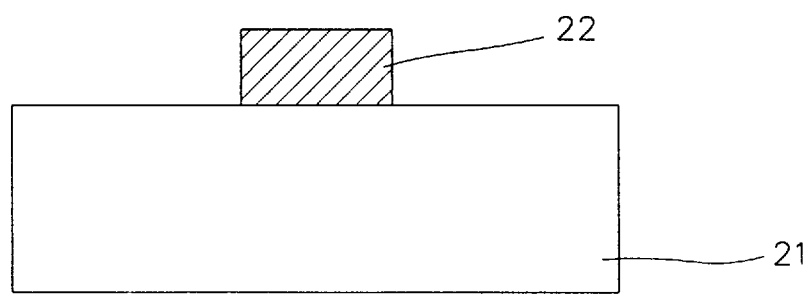
Figure 8C:
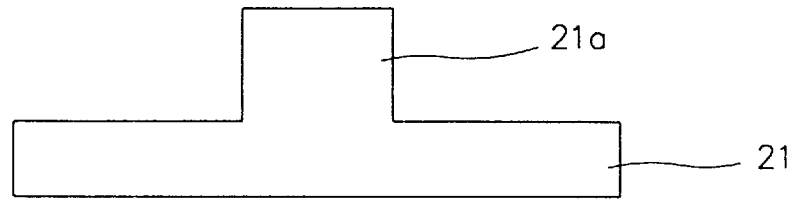

As shown in FIGS. 8A through 8C, a photoresist pattern 22 is formed on a predetermined portion of the semiconductor substrate 21. The semiconductor substrate 21 is etched by using the photoresist pattern 22 as a mask, thus forming a protrusion 21a. Thereafter, the photoresist pattern 22 is removed.

In another embodiment of the present invention for forming the protrusion 21a on the semiconductor substrate 21, an epitaxial growth blocking material is doped on the semiconductor substrate 21, the thusly doped epitaxial growth blocking material is selectively removed, and then the semiconductor substrate 21 is exposed. Thereafter, the epitaxial growth process is sequentially performed. Compared to the method of etching the semiconductor substrate 21 by using the photoresist film as a mask, in the epitaxial growth method, the lateral surface of the protrusion 21a is made flat, so that it is possible to enhance the characteristic of the semiconductor device.

Figure 8D:
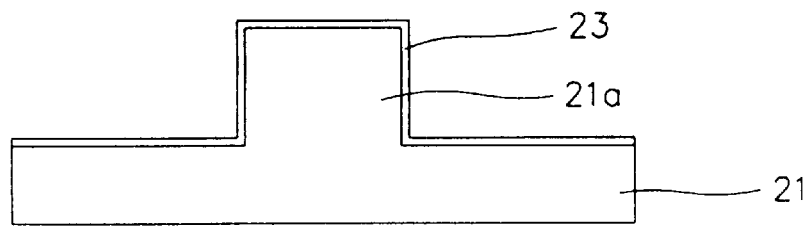
Figure 8E:
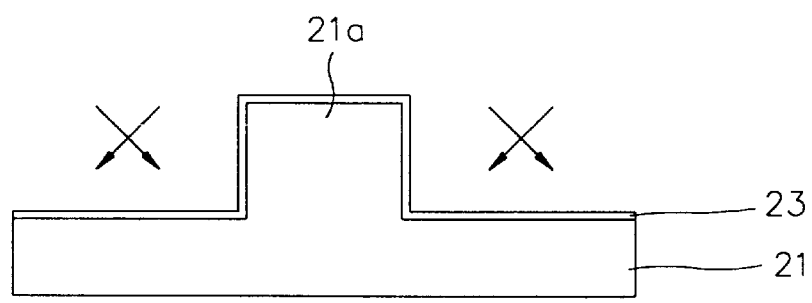

The insulation layer, namely, the gate oxide film 23 is formed on the upper surface and the lateral surface of the protrusion 21a formed on the semiconductor substrate 21 and on the whole surface of the semiconductor substrate 21 as shown in FIG. 8D. Thereafter, ion is implanted into the lateral surface of the protrusion and a predetermined portion of the semiconductor substrate 21 neighboring with the lateral surface of the protrusion in order to adjust the threshold voltage Vt as shown in FIG. 8E. At this time, the ion implantation is performed at a slanted angle of about 60°.

Figure 8F:
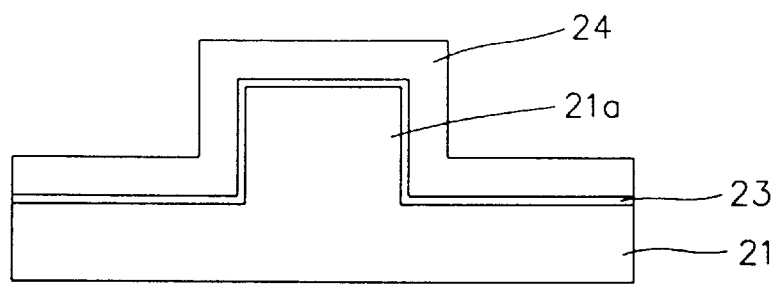
Figure 8G:
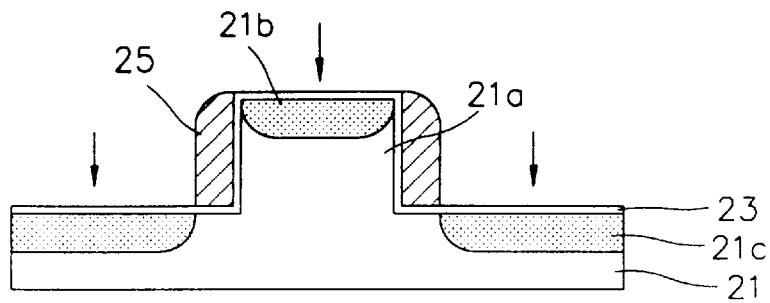

As shown in FIG. 8F, a polysilicon layer 24 on which a boron ion is doped is formed on the whole surface of the gate oxide film 23, and the polysilicon layer 24 is etched back by a reactive ion etching (RIE) method. Thereafter, a sidewall spacer 25 which is formed of a polysilicon layer, is formed on the lateral surface of the protrusion 21a and the gate oxide film 23 formed on the semiconductor substrate 21 as shown in FIG. 8G. A dopant ion is implanted into the upper surface of the protrusion 21a and a predetermined portion of the semiconductor substrate 21 neighboring with the polysilicon sidewall spacer 25 for thus forming a first dopant region, namely, a source electrode 21b, and a second dopant region, namely, a drain electrode 21c. Since the polysilicon sidewall spacer 25 acts as a gate electrode and word line in the semiconductor device, hereinafter the same is called as a gate electrode 25.

Figure 8H:
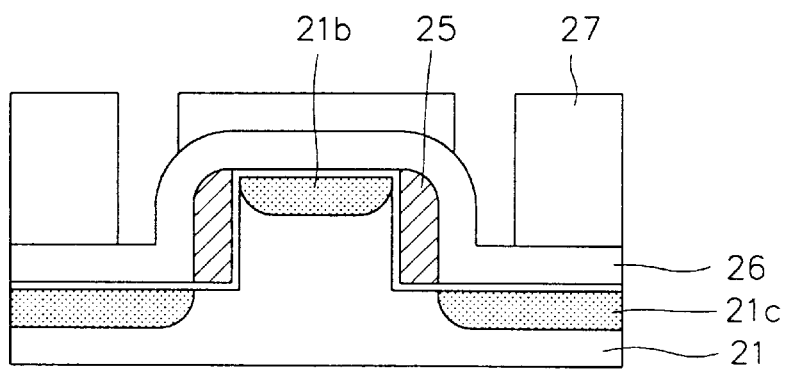

As shown in FIG. 8H, the insulation layer 26 is formed on the upper surfaces of the gate oxide film 23 and the gate electrode 25, and the photoresist pattern 27 is formed on the insulation layer 26 and to be parallel to expose a portion of the insulation layer 26 as shown in FIG. 8H.

Figure 8I:
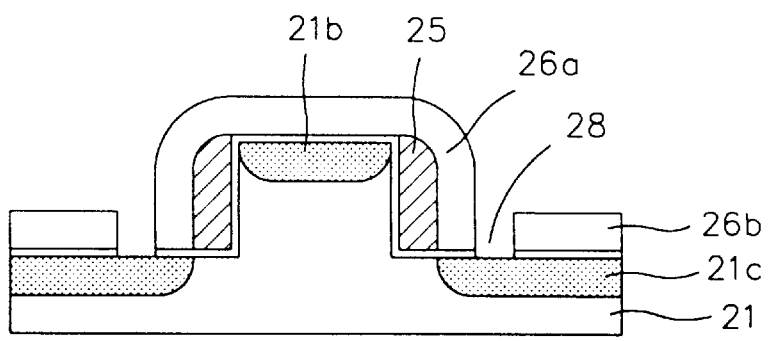

Then, the insulation film 26 and the gate oxide film 23 are etched by using the photoresist pattern 27 as a mask, so that a contact hole 28, as shown in FIG. 8I, is formed in a predetermined portion of the drain region 21c, and the insulation film 26 becomes insulation film patterns 26a and 26b.

Figure 8J:
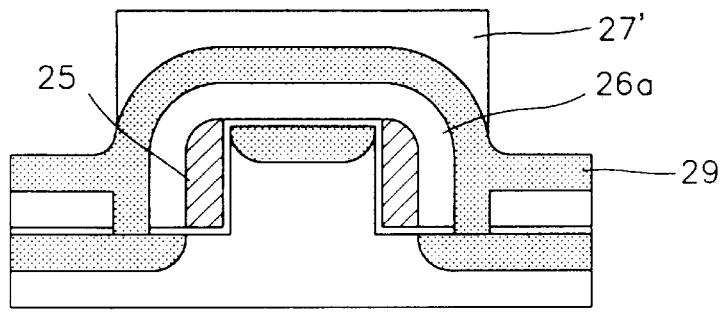
Figure 8K:
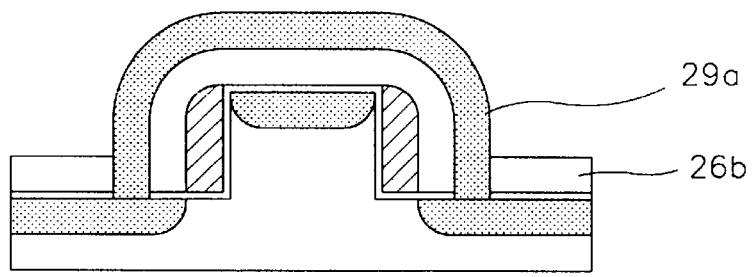

As shown in FIGS. 8J and 8K, a polysilicon layer 29 on which a dopant such as Boron is doped, is deposited on the insulation film patterns 26a and 26b and the contact hole 28. Here, the doped polysilicon 29 is used to reduce the resistance when contacting with the drain region 21c. Thereafter, a photoresist pattern 27' is formed on the polysilicon 29, and the polysilicon layer 29 is etched by using the photoresist film pattern 27' as a mask for thus forming the polysilicon layer pattern 29a. The polysilicon layer pattern 29a is used a space anode electrode 29a which is a first electrode of the capacitor.

Figure 8L:
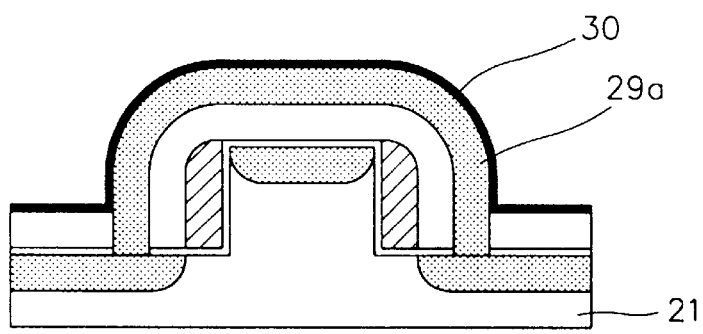
Figure 8M:
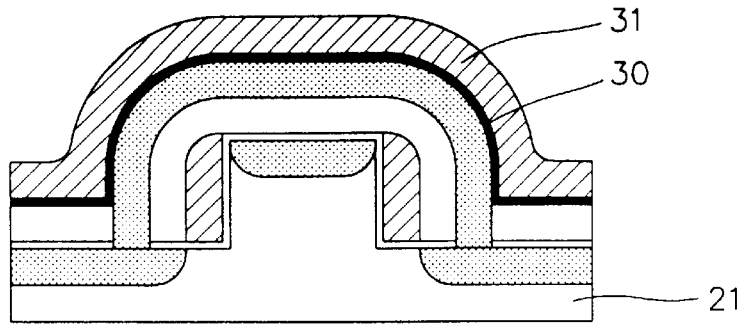
Figure 8N:
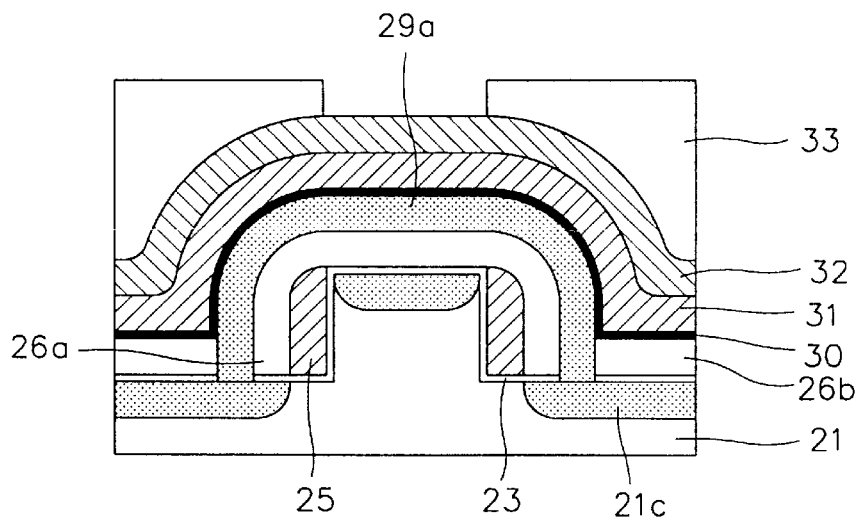

As shown in FIGS. 8L through 8N, the interlayer insulation layer 30, a p-type dopant-doped polysilicon film 31, and the insulation film 32 are sequentially formed on the polysilicon pattern 29a and the insulation film pattern 26b. The interlayer insulation film 30 is formed for being used as a dielectric of the capacitor, and the polysilicon 31 is used as a polysilicon electrode 31 which is a second electrode of the capacitor. The interlayer insulation layer 30 is made of a material such as BST or $Ta_2O_5$ having a high inductivity in order to increase the electrostatic capacity. The photoresist pattern is formed on the insulation film 32.

Figure 8O:
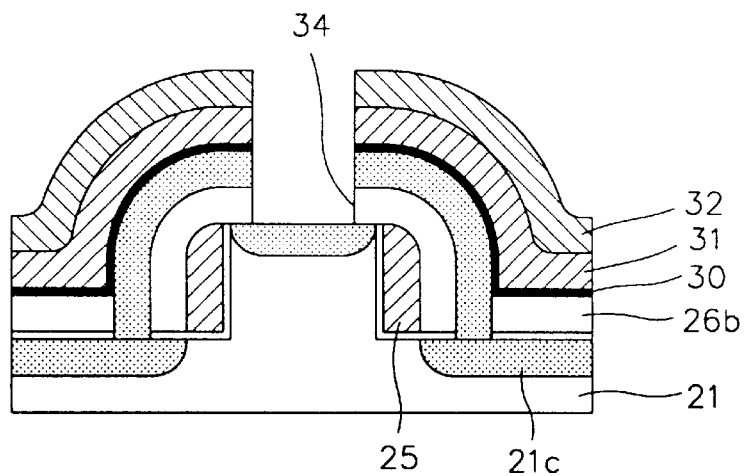

As shown in FIG. 8O, the insulation film 32, the polysilicon 31, the interlayer insulation film 30, the polysilicon pattern 29a, and the insulation film pattern 26a are etched by using the photoresist pattern 33 as a mask so that the source electrode 21b formed on the upper surface of the protrusion 21a is exposed, thus forming a contact hole 34.

Figure 8P:
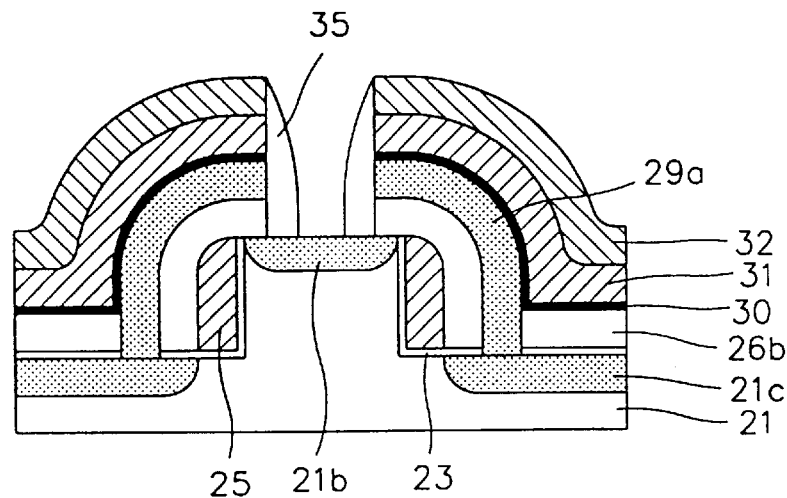

As shown in FIG. 8P, a sidewall spacer 35 made of an insulation material is formed on a lateral surface of the contact hole 34 formed of the insulation film 32, the polysilicon 31, the dielectric 30, the polysilicon pattern 29a and the insulation film pattern 26a.

Figure 8Q:
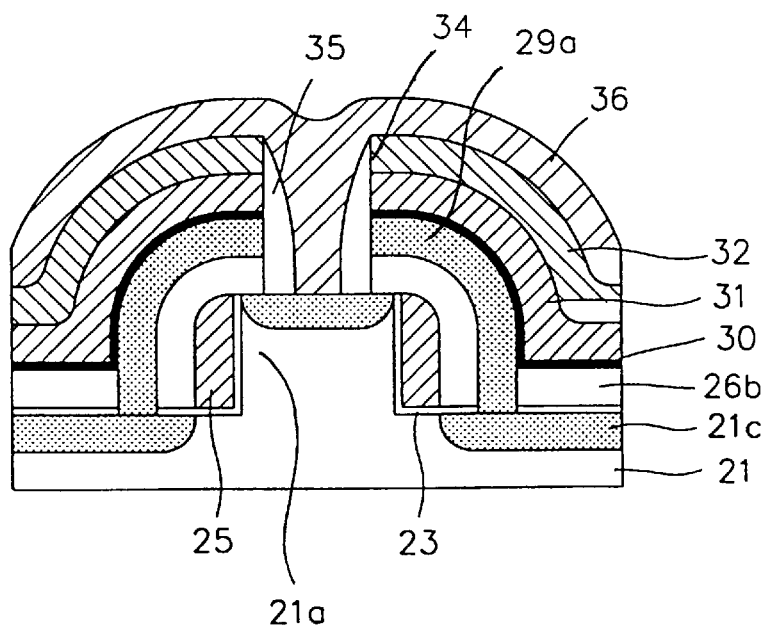

As shown in FIG. 8Q, the polysilicon layer 36 is formed on an inner surface of the contact hole 34 and on the insulation film 32, and the resultant structure is patterned, thus forming a bit line 36.

As described above, in the semiconductor device and the fabrication method thereof according to the present invention, since the channel of the semiconductor device is formed vertically with respect to the semiconductor substrate, it is possible to adjust the length of the channel by adjusting the height of the protrusion irrespective of a design rule. Therefore, it is possible to prevent a short channel effect.

In addition, since the gate electrode is formed around the channel, the width of the channel may be increased, and the driving force of the transistor is increased.

Since the capacitor is formed to surround the circular protrusion, the area of the capacitor and the electrostatic capacity thereof are increased.

Since the word line is vertically formed, the area for the width of the word line is decreased in the semiconductor substrate compared to the conventional structure of a horizontal surface, and integration may be increased.

Since the contact region of the drain electrode and the capacitor node electrode is formed around the outer portions of the gate electrode, the contact area may be increased. Therefore, it is possible to reduce the contact resistance.

The construction of the semiconductor device according to the present invention is more simple compared to the conventional fin type and pillar type capacitor, thus significantly reducing fabrication time of the semiconductor device.

When forming a conventional pillar type and fin type capacitor, it is difficult to evenly deposit the dielectric film having a high inductivity such as $Ta_2O_5$ on a complicated node electrode, so that it is impossible to actually use the conventional capacitor. However, in the present invention, since the structure of a cylindrical capacitor is simple, and it is possible to use a high inductivity, the electrostatic capacity may be more effectively increased compared to the conventional structure.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. A semiconductor device fabrication method comprising the steps of:

preparing a semiconductor substrate having a protrusion;

forming a first insulation film on a lateral surface of the protrusion and on a portion of the semiconductor substrate neighboring with the protrusion;

forming a conductive sidewall spacer on the first insulation film formed on a lateral surface of the protrusion;

forming a first dopant region on an upper surface of the protrusion and forming a second dopant region in the semiconductor substrate in an outer portion of the conductive sidewall spacer;

forming an insulation layer on the semiconductor substrate including the conductive sidewall spacer, forming an insulation film pattern, and forming a contact region so that a portion of the second dopant region is exposed;

forming a first conductive layer pattern on the insulation film pattern and the contact region;

forming an interlayer insulation layer on the first conductive layer pattern; and forming a second conductive layer pattern on the interlayer insulation layer.

2. The semiconductor device fabrication method of claim 1, wherein said step of preparing the semiconductor substrate having the protrusion includes the sub-steps of:

forming a photoresist pattern on the semiconductor substrate; and etching the semiconductor substrate by using the photoresist pattern as a mask.

3. The semiconductor device fabrication method of claim 1, wherein said step of preparing the semiconductor substrate having the protrusion includes the sub-steps of:

forming an epitaxial growth blocking film on the semiconductor substrate;

forming a photoresist pattern on the epitaxial growth blocking film;

etching the epitaxial growth blocking film by using the photoresist pattern as a mask and exposing a surface of the semiconductor substrate;

removing the photoresist pattern;

performing an epitaxial growth process with respect to the semiconductor substrate; and removing the epitaxial growth blocking film.

4. The semiconductor device fabrication method of claim 1, further comprising a step of implanting an ion at a slanted angle for adjusting a threshold voltage after forming the first insulation film.

5. The semiconductor device fabrication method of claim 4, wherein said slant angle ion implantation is performed at an angle in a range of about 45° to 60°.

6. The semiconductor device fabrication of claim 1, wherein said step of forming the first conductive layer pattern on the insulation film pattern and in the contact region includes the sub-steps of:

depositing a polysilicon layer on an upper surface of the insulation film pattern and in the contact region;

implanting a dopant ion into the polysilicon layer; and forming an anode electrode by patterning the polysilicon layer.

7. The semiconductor device fabrication method of claim 1, wherein said step of forming the first conductive layer on the upper surface of the insulation film pattern and in the contact region includes the sub-steps of:

forming an ion-doped polysilicon layer on an upper surface of the insulation film pattern and in the contact region; and forming a node electrode by patterning the polysilicon layer.

8. The semiconductor device fabrication method of claim 7, wherein said step of forming the ion-doped polysilicon layer includes a step of adding a dopant to a deposition gas, thus performing a chemical vapor deposition process.

9. The semiconductor device fabrication method of claim 1, further comprising the steps of:

forming a second insulation film on the second conductive layer pattern;

forming a contact hole through to an upper surface of the protrusion;

forming a conductive sidewall spacer on a lateral surface of the contact hole; and forming a third conductive layer pattern in the contact hole and on an upper surface of the second insulation film.

10. A semiconductor device fabrication method comprising the steps of:

forming a semiconductor substrate having a protrusion;

forming a first insulation film on a lateral surface of the protrusion and on the semiconductor substrate surrounding the protrusion;

forming a conductive sidewall spacer on the first insulation film formed on the lateral surface of the protrusion;

forming a first dopant region on an upper surface of the protrusion and a second dopant region in the semiconductor substrate surrounding the conductive sidewall spacer;

forming an insulation layer on the protrusion, the conductive sidewall spacer and the semiconductor substrate surrounding the conductive sidewall spacer, the insulation layer having a contact hole therethrough exposing a contact region on the second dopant region;

forming a first conductive layer on the insulation layer and the contact region;

forming an interlayer insulation layer on the first conductive layer; and forming a second conductive layer on the interlayer insulation layer.

11. The semiconductor device fabrication method of claim 10, wherein said step of forming the first conductive layer on the insulation layer and the contact region comprises:

forming an ion-doped polysilicon layer on an upper surface of the insulation layer and the contact region; and forming a node electrode by patterning the polysilicon layer.

12. The semiconductor device fabrication method of claim 11, wherein said step of forming the ion-doped polysilicon layer comprises a step of adding a dopant to a deposition gas, thus performing a chemical vapor deposition process.

13. The semiconductor device fabrication method of claim 10, further comprising a step of implanting an ion at a slanted angle into the first insulation film to adjust a threshold voltage.

14. The semiconductor device fabrication method of claim 13, wherein the ion is implanted at an angle in a range of about 45° to 60°.

15. The semiconductor device fabrication method of claim 10, wherein said step of forming the semiconductor substrate having the protrusion comprises:

forming a photoresist pattern on a semiconductor substrate; and etching the semiconductor substrate using a mask to form the protrusion.

16. The semiconductor device fabrication method of claim 10, wherein said step of forming the semiconductor substrate comprises:

forming an epitaxial growth blocking film on a semiconductor substrate;

forming a photoresist pattern on the epitaxial growth blocking film;

etching the epitaxial growth blocking film using the photoresist pattern as a mask and exposing a surface of the semiconductor substrate;

removing the photoresist pattern;

performing an epitaxial growth process with respect to the semiconductor substrate to form the protrusion; and removing the epitaxial growth blocking film.

17. The semiconductor device fabrication of claim 10, wherein said step of forming the first conductive layer on the insulation layer and the contact region comprises:

depositing a polysilicon layer on the insulation layer and the contact region;

implanting a dopant ion into the polysilicon layer; and forming an anode electrode by patterning the polysilicon layer.

18. The semiconductor device fabrication method of claim 10, further comprising:

forming a second insulation film on the second conductive layer;

forming a second contact hole through to the protrusion;

forming a conductive sidewall on a lateral surface of the second contact hole; and forming a third conductive layer in the contact hole and on the second insulation film.

* * * * *